United States Patent [19]

Lukawich

[11] Patent Number: 4,475,784

[45] Date of Patent: Oct. 9, 1984

[54] CARTRIDGE AND RECEPTACLE FOR USE WITH AN ELECTRONICALLY CONTROLLED APPLIANCE

[75] Inventor: Joseph Lukawich, Somerville, N.J.

[73] Assignee: The Singer Company, Stamford, Conn.

[21] Appl. No.: 446,155

[22] Filed: Dec. 2, 1982

[51] Int. Cl.³ ............................................ H01R 13/453
[52] U.S. Cl. ..................................... 339/43; 339/44 R
[58] Field of Search ..................... 339/42, 43, 40, 44 R

[56] References Cited

U.S. PATENT DOCUMENTS

| | | | |
|---|---|---|---|
| 3,465,280 | 9/1969 | Paganelli . | |
| 4,095,791 | 6/1978 | Smith et al. . | |
| 4,149,027 | 4/1979 | Asher et al. . | |
| 4,176,897 | 12/1979 | Cameron | 339/43 |
| 4,243,284 | 1/1981 | Humphreys | 339/43 |
| 4,345,808 | 8/1982 | Ingham | 339/43 |

Primary Examiner—Joseph H. McGlynn
Assistant Examiner—Paula Austin
Attorney, Agent, or Firm—David L. Davis; Robert E. Smith; Edward L. Bell

[57] ABSTRACT

An improved cartridge and receptacle therefor for use with an electronically controlled appliance includes within the receptacle a vertically movable platform having a pivoting door. A printed circuit board extends upwardly within the appliance housing and acts as a terminal member connected to electronic circuitry within the appliance. The cartridge includes a pair of outwardly extending prongs which fit into openings in the top of the platform to release spring biased latches which otherwise maintain the platform in its upper position. A camming surface on the platform door co-operates with the circuit board to pivot the door away from an elongated opening in the platform when the platform is lowered and the printed circuit board extends through that elongated opening into an elongated opening within the cartridge, where it causes a spring biased door to be pivoted inwardly. The printed circuit board enters a connector within the cartridge which is coupled to circuitry mounted within the cartridge. Removal of the cartridge releases the printed circuit board from the connector and raises the platform. As the printed circuit board leaves the cartridge, the spring biased door pivots to close the opening of the cartridge. As the platform is raised, a camming surface within the receptacle pivots the platform door to its closed position. Removal of the cartridge from the platform allows the latches to spring outwardly so that they rest on shoulders provided therefor, thereby preventing the platform from being lowered into the receptacle without the insertion of a cartridge.

7 Claims, 8 Drawing Figures

CARTRIDGE AND RECEPTACLE FOR USE WITH AN ELECTRONICALLY CONTROLLED APPLIANCE

DESCRIPTION

Background of the Invention

This invention relates to electronically controlled appliances and, more particularly, to a cartridge and receptacle therefor to expand the functions of the appliance.

In recent years, the application of sophisticated electronic control to appliances has become more widespread. In particular, the use of programmed microprocessers and microcomputers to control appliances is becoming more and more commonplace. Thus, for example, sewing machines having internal microcomputers are capable of sewing a relatively large number of decorative patterns, the information for sewing which is all stored within the integrated circuitry making up the microcomputer. Typically, a microcomputer includes a read only memory (ROM) which stores all of the information required to sew the various stitch patterns. Accordingly, one limitation as to the number of patterns which may be sewn is the size of the ROM. Another limitation is that only those patterns which have been programmed may be sewn, there typically being no provision for changing the ROM. Thus, in an attempt to overcome these limitations, appliance designers have developed external cartridges which may be plugged into the appliance, these cartridges consisting of supplementary ROM's which contain additional information for expanding the functional capability of the appliance. Accordingly, it is a primary object of this invention to provide a cartridge for containing such a ROM as well as a receptacle in the appliance through which the supplementary ROM may be connected to the internal circuitry within the appliance.

When designing such a cartridge and receptacle, there are a number of requirements which must be taken into consideration. For example, it is desirable to be able to prevent as much as possible contamination of the cartridge and receptacle by dirt, which dirt could affect the electrical characteristics of the appliance. It is also desirable to prevent tampering, especially with the internal circuitry of the appliance which could occur through the receptacle. Additionally, it is desirable to insure that only the proper cartridge is utilized with the appliance and therefore the receptacle and cartridge should be so designed. It is therefore a further object of this invention to satisfy the foregoing and additional requirements.

SUMMARY OF THE INVENTION

The foregoing and additional objects are attained in accordance with the principles of this invention by providing, in combination with an appliance having a housing and circuitry connected to a first terminal member mounted within the housing, an arrangement for connecting additional circuitry to that circuitry through the first terminal member, the arrangement comprising a cartridge and a receptacle therefor. The cartridge includes a shell having an opening, means for securing the additional circuitry within the shell, and a second terminal member connected to the additional circuitry and adapted for mating connection with the first terminal member, the second terminal member being fixedly mounted inside the shell in proximity to the opening so that an incursion of the first terminal member into the opening will result in a mating connection therewith. The receptacle includes a casing mounted on and extending through the housing, the casing having an opening. The first terminal member is mounted within the casing away from the opening. A platform is supported within the casing for translatory motion between first and second positions within the casing, the platform having an opening adapted to receive the first terminal member therethrough when in the second position and the platform substantially blocking the casing opening when in the first position. The receptacle further includes a latch assembly mounted on the platform for retaining the platform in the first position and cooperating with the cartridge for releasing the platform to allow the platform to be moved to the second position upon application of a force to the platform through the cartridge.

BRIEF DESCRIPTION OF THE DRAWINGS

The foregoing will be more readily apparent upon reading the following description in conjunction with the drawings wherein.

DETAILED DESCRIPTION

Figure 1:
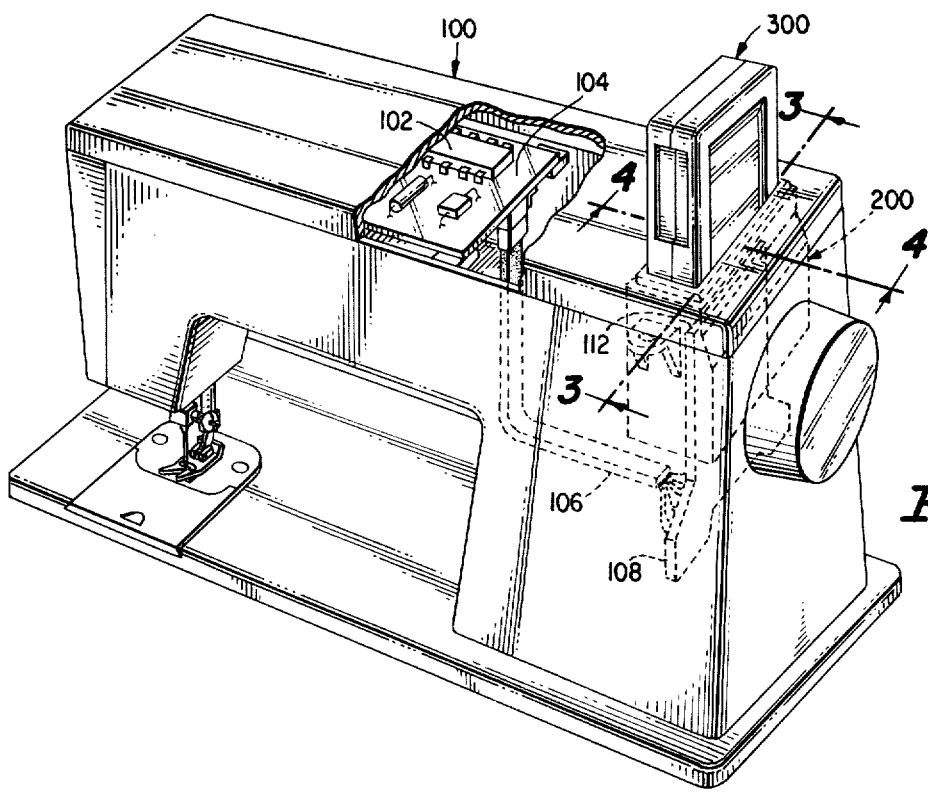
FIG. 1 is a perspective view showing a sewing machine frame having installed therein a receptacle according to the present invention in which there has been inserted a cartridge constructed in accordance with the principles of this invention.

Referring now to the drawings, wherein like elements in the different figures thereof have the same reference numeral applied thereto, FIG. 1 shows generally the housing of a sewing machine designated by the reference numeral 100 which has installed therein a receptacle designated by the reference numeral 200 constructed in accordance with the principles of this invention and into which there has been inserted a cartridge 300 constructed in accordance with this invention. The receptacle 200 is installed within the housing 100 so that its upper end is substantially flush with the top surface of the housing 100, as is more clearly shown in FIGS. 3A and 4A. The housing 100 of the sewing machine shown in FIG. 1, includes therein circuitry 102 illustratively mounted on a board 104 which is connected via a cable 106 to a first terminal member 108, which is illustratively a printed circuit board.

Figure 2:
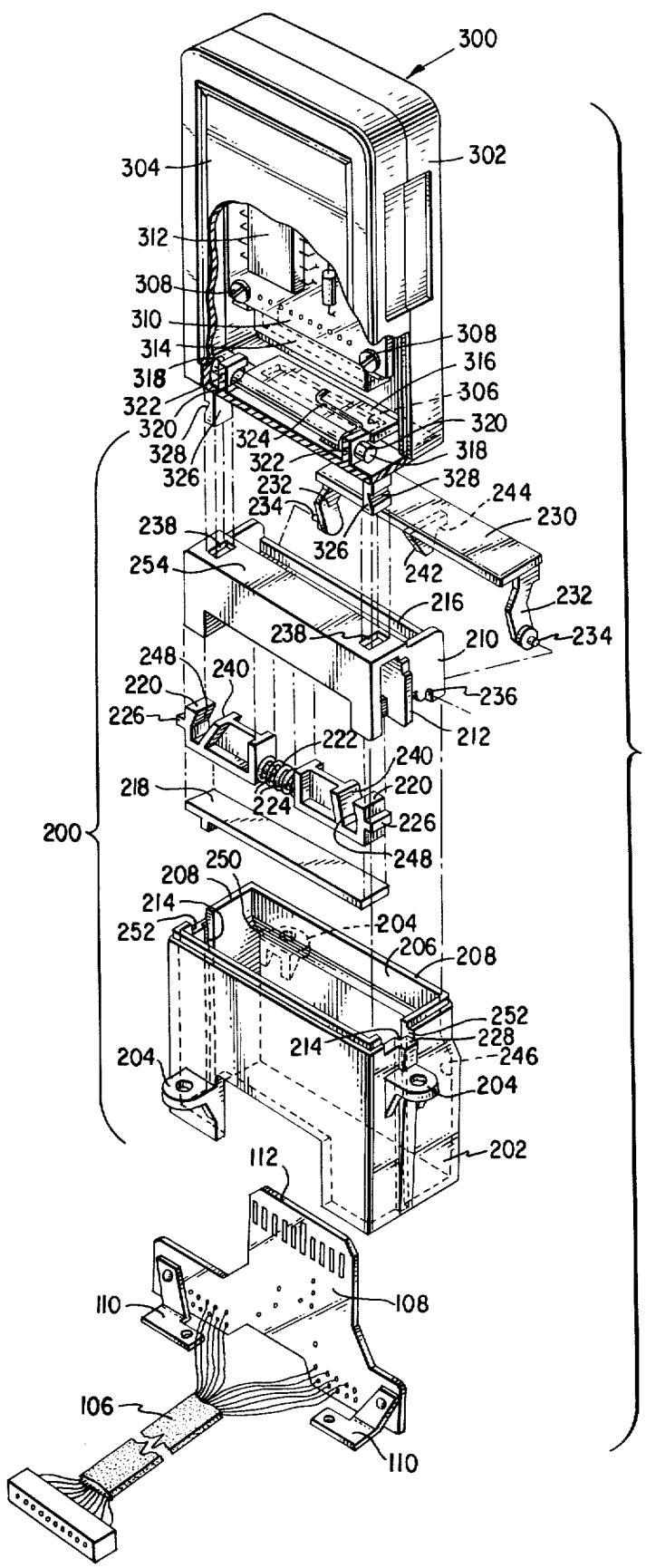
FIG. 2 is an exploded perspective view, partially cut away, showing a cartridge and receptacle constructed in accordance with the principles of this invention.

As shown in FIG. 2, the receptacle 200 includes a casing 202 which is provided with a plurality of ears 204 for use in mounting the casing 202 to the housing 100. The casing 202 is formed with an opening 206 and when the casing 202 is mounted within the housing 100, the edges 208 surrounding the opening 206 are below the top surface of the housing 100, as is more clearly shown in FIGS. 4A-4C. The first terminal member 108 is mounted within the casing 202 and away from the opening 206 by means of brackets 110, or the like. A platform 210 is supported within the casing 202 for translatory motion therein. The platform 210 has a pair of outwardly extending bosses 212 on opposite ends of the platform 210, only one of which is shown in FIG. 2, and the casing 202 has a pair of longitudinal grooves 214 on two of its inner walls in which the bosses 212 are adapted to move. The platform 210 also includes an elongated opening 216 at its upper end. This opening 216 is situated so that when the platform 210 moves downwardly toward the lower end of the casing 202, the first terminal member 108 extends through the opening 216.

Secured within the platform 210 by means of a support strap 218 are a pair of latch members 220 separated by a coil spring 222. Each of the latch members 220 has a preferably generally circular protuberance 224 at one end thereof around which the inner opening of the coil spring 222 is placed. At the other end of each of the latch members 220, there is formed an extension 226 which is adapted to rest on a shoulder 228 at the upper end of the casing 202 when the platform 210 is at its extreme upward position, in order to maintain the platform 210 in this position with respect to the casing 202. The coil spring 220 serves to bias the latch members 220 outwardly so that the extensions 226 remain on the shoulders 228. As will be described in more detail hereinafter, the insertion of the cartridge 300 forces the latch members 220 inward against the biasing force of the spring 222 to bring the extensions 226 off the shoulders 228 so that the platform 210 may move downwardly within the casing 202.

A door 230 is also provided for closing the elongated opening 216 of the platform 210. Accordingly, the door 230 is formed with a pair of arms 232 at either end thereof, each of which is formed with a pivot pin 234 at its extremity. The pivot pins 234 fit in suitable recesses 236 provided therefor in the platform 210, the arms 232 extending within the opening 216.

The cartridge 300 is formed of a pair of shell members 302 and 304. The rear shell member 302 is formed at its lower edge, as viewed in FIG. 2, with an elongated notch 306 whereas the front shell member 304 is formed with a flat edge which mates with the elongated notch 306 when the shell members 302 and 304 are placed together so as to form an elongated opening adapted to receive therethrough the first terminal member 108. Trapped between internal ribs (not shown) of the rear shell member 302 and the front shell member 304, is a circuit board 310 upon which is mounted the additional circuitry 312 which it is desired to connect to the circuitry 102 within the housing 100. Secured to the circuit board 310, by screws 308 or the like, is a second terminal member 314. The second terminal member 314 is electrically connected to the additional circuitry 312 and is adapted for mating connection with the first terminal member 108. Illustratively, the first terminal member 108 is a printed circuit board and the second terminal member 314 is a female printed circuit board connector.

The cartridge 300 is provided with a door 316 having a pair of pivot pins 318 which fit in appropriate recesses 320 provided in extension members 322 formed inside the front shell member 304. A torsion spring 324 is fitted about one of the pivot pins 318 to bias the door 316 in a position where it closes the opening in the cartridge 300 formed by the elongated notch 306.

The front shell member 304 is further formed with a pair of externally extending prongs 326. As will be described in more detail hereinafter, the prongs 326 are adapted to be inserted through a pair of openings 238 formed in the platform 210 and cooperate with the latch members 220 to release the platform 210 from its extreme upward position.

Figure 3C:
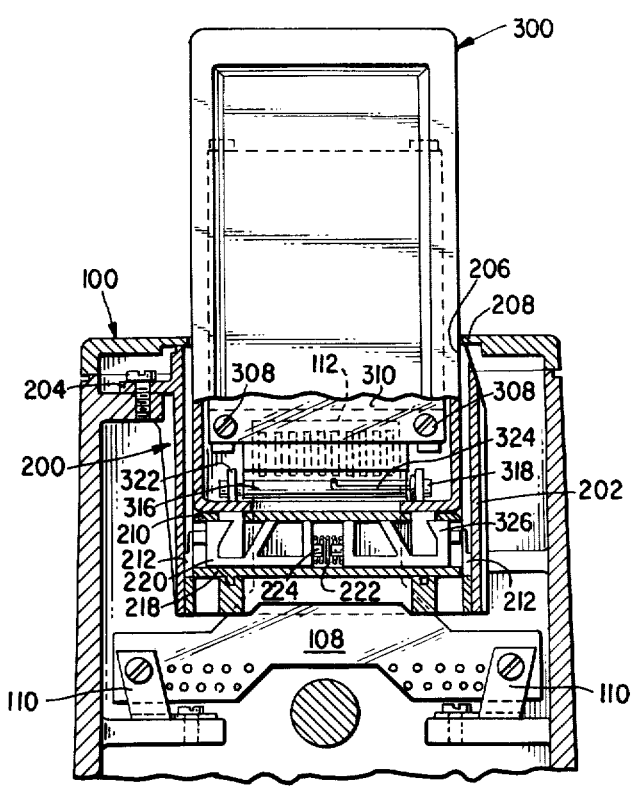
FIGS. 3A, 3B and 3C are cross sectional views taken substantially along the line 3—3 in FIG. 1 showing sequential stages in the insertion of a cartridge into a receptacle in accordance with the principles of this invention.
Figure 4C:
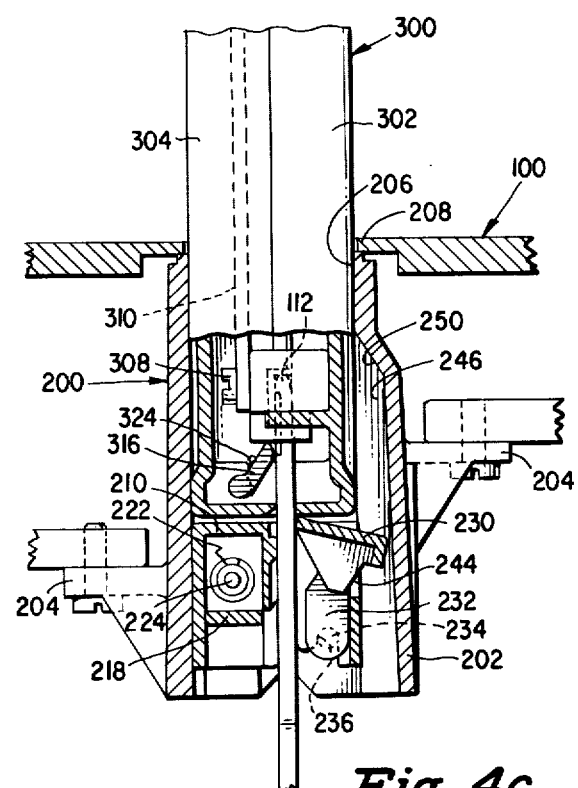
FIGS. 4A, 4B and 4C are cross sectional views taken substantially along the line 4—4 in FIG. 1 corresponding to the sequence depicted in FIGS. 3A, 3B and 3C, but drawn to an enlarged scale.
Figure 3A:
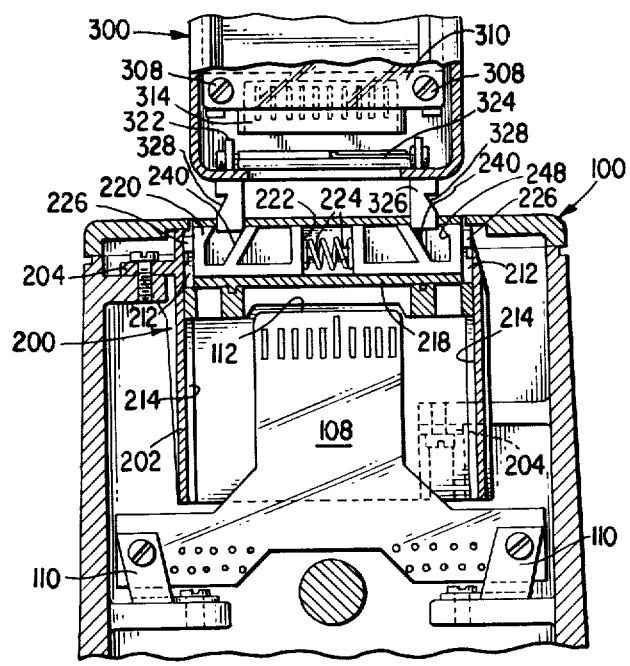
Figure 4A:
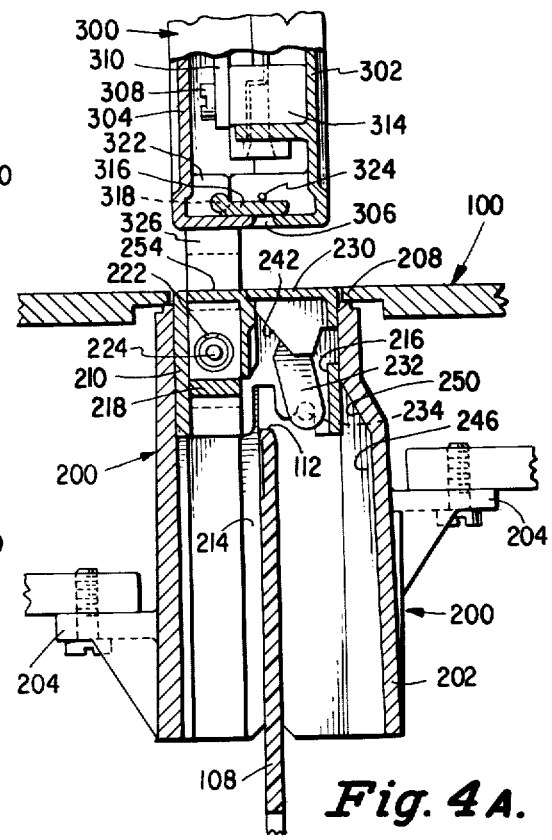
Figure 3B:
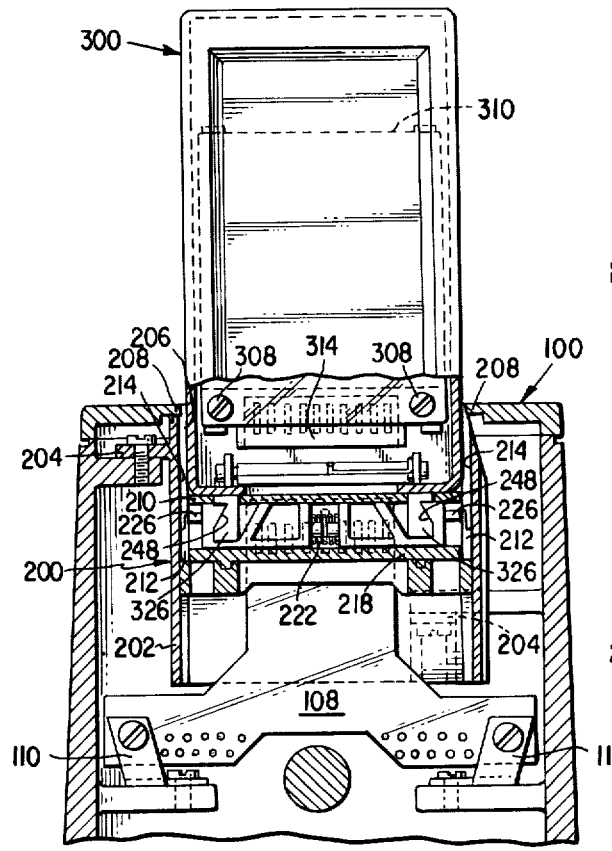
Figure 4B:
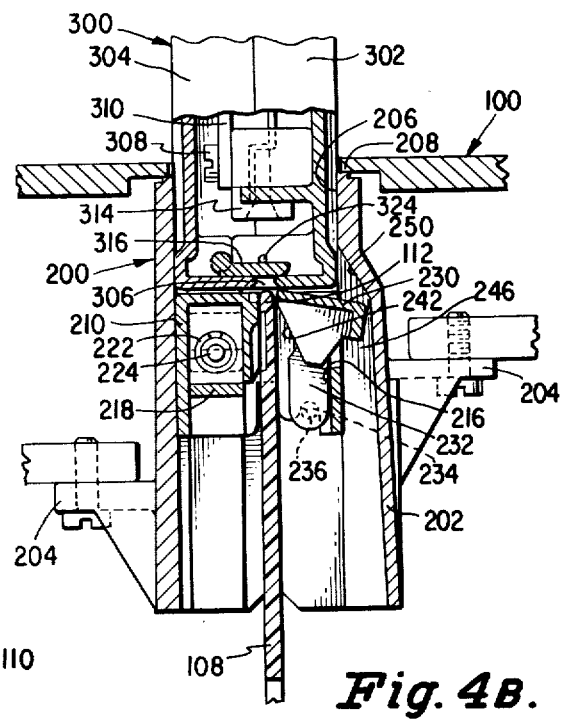

The sequence of operation will now be described with reference to FIGS. 3A-3C and 4A-4C. In particular, FIGS. 3A and 4A are illustrative of the prongs 326 initially being inserted into the openings 238; FIGS. 3B and 4B are illustrative of the cartridge 300 pushing the platform 210 partially downward to the point where the first terminal member 108 is about ready to exit the opening 206; and FIGS. 3C and 4C illustrate the condition where the cartridge 300 is fully inserted so that the first terminal member 108 and the second terminal member 314 are connected together. As shown in FIG. 3A, as the prongs 326 enter the openings 238, they ride against the inclined surfaces 240 of the latch members 220. The prongs 326 are stiff so that they cannot move with respect to each other or to the cartridge 300 and accordingly, the latch members 220 are forced closer together against the action of the coil spring 222. This releases the extensions 226 from the shoulders 228, allowing the platform 210 to ride downwardly within the casing 202 under a downward force applied thereto through the cartridge 300. As is best seen in FIG. 4B, as the cartridge 300 moves the platform 210 approximately half way down its path of travel within the casing 202, the platform 210 reaches a point where the upper edge 112 of the first terminal member 108 rides against a camming surface 242 formed on a rib 244 underneath the door 230 so as to cause the door 230 to pivot in a clockwise direction, as viewed in FIG. 4B, which pivoting action exposes the opening 216 of the plaform 210. To accommodate the pivoting of the door 230, the casing 202 is formed with an outwardly bulging region 246. As the cartridge 300 is pushed further downwardly, the first terminal member 108 next passes through the opening in the cartridge 300 formed by the notch 306. As best seen in FIG. 4C, the first terminal member 108 pivots the door 316 away from that opening and then the first terminal member 108 enters the second terminal member 314 where it is frictionally engaged therewith. Since there are no upwardly biasing forces applied to either the platform 210 or the cartridge 300, the condition depicted in FIGS. 3C and 4C is stable and remains so until the appliance user desires to remove the cartridge 300.

When the user desires to remove the cartridge 300 from the receptacle 200, an upward force is applied to the cartridge 300 and the previously described sequence is reversed. Thus, initially the first terminal member 108 is released from its frictional engagement by the second terminal member 314. As the cartridge 300 is moved upwardly, the slanted surfaces 328 of the prongs 326 bear against the surfaces 248 of the corresponding latch members 220 to cause them, along with the platform 210, to rise with the cartridge 300. As the cartridge 300 rises, the door 316 passes the upper edge 112 of the first terminal member 108 and as the terminal member 108 passes outwardly through the opening of the cartridge 300 formed by the elongated notch 306, the door 316 is allowed to close under the biasing force of the torsion spring 324. Further upward motion of the cartridge 300 causes the platform 210 to rise so that the first terminal member 108 passes through the opening 216 of the platform 210 and the door 230 passes the upper edge 112 of the first terminal member 108, freeing the door 230 to close the opening 216. This occurs as the door passes the inclined surface 250 forming a part of the inner wall of the casing 202. This inclined surface 250 insures that the door 230 closes off the opening 216. Further upward motion of the cartridge 300 causes the platform 210 to reach a point where the extensions 226 are free of the inner walls of the casing 202 and can move outwardly due to the force of the spring 222 so as to extend into the notches 252 formed above the shoulders 228. Still further upward movement of the cartridge 300 will release the latch members 220 from the prongs 326 and allow the prongs 326 to be removed from the openings 238 of the platform 210. The platform 210 is prevented from rising any further because the housing 100 covers the edges 208 surrounding the opening 206 of the receptacle 200, acting as a stop for the bosses 212 at the upper ends of the longitudinal grooves 214. Thus, when the cartridge 300 is removed, the door 316 closes off the opening to the cartridge 300 and the top surface 254 and the door 230 of the platform 210 close off the opening 206 of the casing 202 and are substantially flush with the surface of the housing 100.

Accordingly, there has been disclosed an improved combination of a cartridge and receptacle for use with an electronically controlled appliance. It is understood that the abovedescribed embodiment is merely illustrative of the application of the principles of this invention. Numerous other embodiments may be devised by those skilled in the art without departing from the spirit and scope of this invention, as defined by the appended claims.

I claim:

1. In combination with an appliance having a housing and circuitry connected to a first terminal member mounted within said housing, an arrangement for connecting additional circuitry to said circuitry through said first terminal member, said arrangement comprising:
   a cartridge including:
      a shell having an opening;
      means for securing said additional circuitry within said shell; and
      a second terminal member connected to said additional cricuitry and adapted for mating connection with said first terminal member, said second terminal member being fixedly mounted inside said shell in proximity to said opening so that an incursion of said first terminal member into said opening will result in a mating connection therewith;
   a casing mounted on and extending through said housing, said casing having an opening;
   means for mounting said first terminal member within said casing away from said opening;
   a platform supported within said casing for translatory motion between first and second positions within said casing, said platform having an opening adapted to receive said first terminal member therethrough when in said second position, and said platform substantially blocking said casing opening when in said first position; and
   latch means mounted on said platform for retaining said platform in said first position and cooperating with said cartridge for releasing said platform to allow said platform to be moved to said second position upon application of a force to said platform through said cartridge.

2. The arrangement according to claim 1 wherein said cartridge further includes:
   a door pivotally mounted within said shell adjacent said opening; and
   means for biasing said door so as to cover said opening, said door being adapted to pivot and uncover said opening when said first terminal member pushes against said door upon entry into said shell through said opening.

3. The arrangement according to claim 1 wherein said latch means includes:
   a pair of movable latch members;
   means for urging said latch members away from each other;
   each of said latch members having an extension; and
   a pair of shoulders formed on said casing, each of said shoulders adapted to receive thereon a respective one of said extensions, said shoulders being positioned in said casing so that they receive thereon said extensions when said platform is in said first position and said latch members are urged apart.

4. The arrangement according to claim 3 wherein said platform includes a pair of further openings, each of said latch members includes a camming surface thereon, and said cartridge further includes a pair of prongs each adapted to be inserted through one of said platform further openings so as to engage one of said latch member camming surfaces to force said latch members toward each other and said extensions off said shoulders.

5. The arrangement according to claim 3 wherein said latch member extensions are each positioned on an extremity of their respective latch member away from the other of said latch members.

6. The arrangement according to claim 1 further including a door pivotally mounted on said platform and adapted to cover said platform opening when said platform is in said first position, said door including a camming surface adapted to be engaged by said first terminal member as said platform is moved from said first position toward said second position so as to cause said door to be pivotally moved to expose said platform opening and allow said first terminal member to pass therethrough.

7. The arrangement according to claim 6 wherein said casing includes a camming surface adapted to engage said door as said platform is moved from said second position toward said first position so as to cause said door to be pivotally moved to cover said platform opening.

* * * * *